United States Patent
Nahar et al.

(10) Patent No.: US 10,950,384 B2
(45) Date of Patent: Mar. 16, 2021

(54) METHOD USED IN FORMING AN ELECTRONIC DEVICE COMPRISING CONDUCTIVE MATERIAL AND FERROELECTRIC MATERIAL

(71) Applicant: Micron Technology, Inc., Boise, ID (US)

(72) Inventors: Manuj Nahar, Boise, ID (US); Ashonita A. Chavan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/691,541

(22) Filed: Aug. 30, 2017

(65) Prior Publication Data

US 2019/0066917 A1 Feb. 28, 2019

(51) Int. Cl.
*H01F 7/06* (2006.01)
*H01G 4/10* (2006.01)
(Continued)

(52) U.S. Cl.
CPC ............. *H01G 4/10* (2013.01); *H01G 4/30* (2013.01); *H01G 4/33* (2013.01); *H01L 27/1159* (2013.01); *H01L 27/11507* (2013.01); *H01L 28/55* (2013.01); *H01L 29/40111* (2019.08); *H01L 29/516* (2013.01); *H01L 29/6684* (2013.01); *H01L 29/78391* (2014.09)

(58) Field of Classification Search
CPC .................................. H01G 4/30; H01G 4/10
See application file for complete search history.

(56) References Cited

U.S. PATENT DOCUMENTS 7,709,359 B2   5/2010   Boescke et al.
8,304,823 B2   11/2012  Boescke
(Continued)

FOREIGN PATENT DOCUMENTS

JP       10-163436       6/1998
KR       10-2005-0010650 1/2005

OTHER PUBLICATIONS

WO PCT/US2018/044344 SR, dated Nov. 30, 2018, Micron Technology, Inc.
(Continued)

*Primary Examiner* — Paul D Kim
(74) *Attorney, Agent, or Firm* — Wells St. John P.S.

(57) ABSTRACT

A method used in forming an electronic device comprising conductive material and ferroelectric material comprises forming a composite stack comprising multiple metal oxide-comprising insulator materials. At least one of the metal oxide-comprising insulator materials is between and directly against non-ferroelectric insulating materials. The multiple metal oxide-comprising insulator materials are of different composition from that of immediately-adjacent of the non-ferroelectric insulating materials. The composite stack is subjected to a temperature of at least 200° C. After the subjecting, the composite stack comprises multiple ferroelectric metal oxide-comprising insulator materials at least one of which is between and directly against non-ferroelectric insulating materials. After the subjecting, the composite stack is ferroelectric. Conductive material is formed and that is adjacent the composite stack. Devices are also disclosed.

35 Claims, 4 Drawing Sheets

(51) Int. Cl.
  *H01G 4/30*      (2006.01)
  *H01L 29/66*     (2006.01)
  *H01L 27/1159*   (2017.01)
  *H01L 27/11507*  (2017.01)
  *H01G 4/33*      (2006.01)
  *H01L 29/78*     (2006.01)
  *H01L 49/02*     (2006.01)
  *H01L 21/28*     (2006.01)
  *H01L 29/51*     (2006.01)

(56) References Cited

U.S. PATENT DOCUMENTS

| | | | |
|---|---|---|---|
| 10,038,092 B1* | 7/2018 | Chen | H01L 28/55 |
| 2003/0235720 A1* | 12/2003 | Athey | C03C 17/002 |
| | | | 428/702 |
| 2006/0049440 A1 | 3/2006 | Bruchhaus et al. | |
| 2009/0155931 A1 | 6/2009 | Ma et al. | |
| 2015/0303206 A1 | 10/2015 | Chavan et al. | |
| 2017/0162587 A1 | 6/2017 | Chavan et al. | |
| 2018/0240804 A1* | 8/2018 | Yoo | H01L 21/28291 |

OTHER PUBLICATIONS

WO PCT/US2018/044344 WO, dated Nov. 30, 2018, Micron Technology, Inc.

* cited by examiner

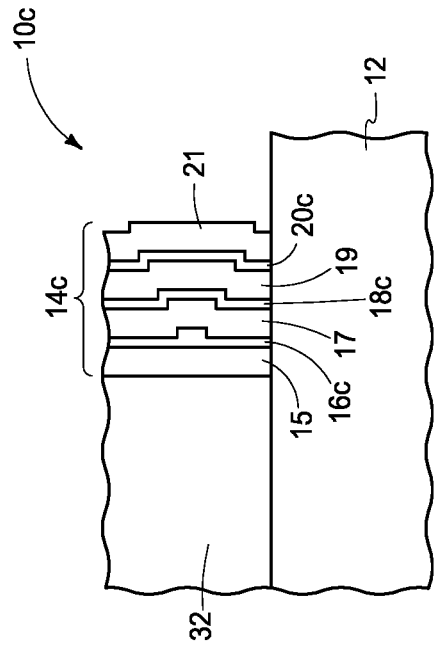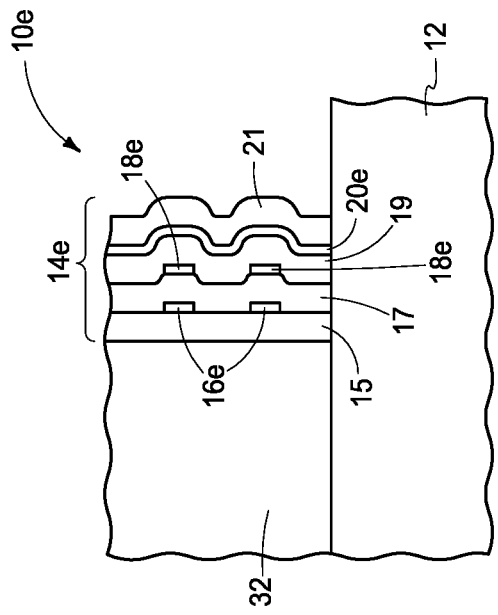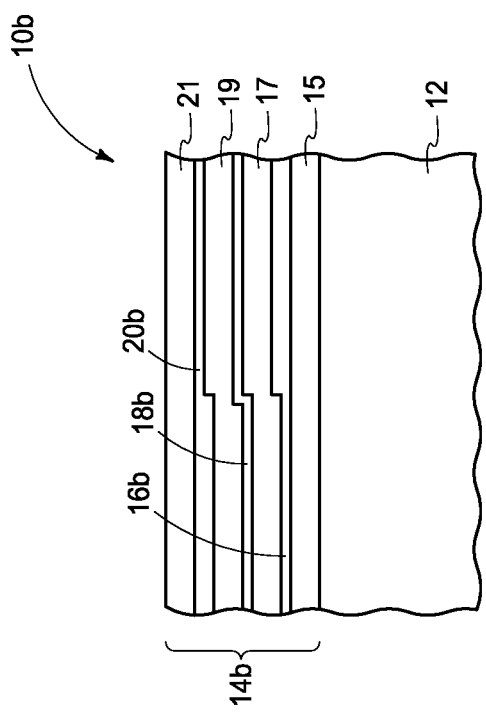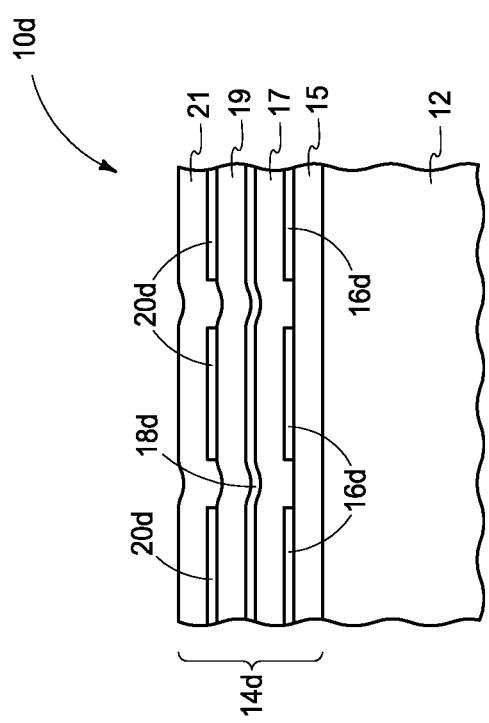

METHOD USED IN FORMING AN ELECTRONIC DEVICE COMPRISING CONDUCTIVE MATERIAL AND FERROELECTRIC MATERIAL

TECHNICAL FIELD

Embodiments disclosed herein pertain to ferroelectric capacitors, to ferroelectric field effect transistors, and to methods used in forming an electronic device comprising conductive material and ferroelectric material.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulating material, that stored field will be volatile or non-volatile. For example, a capacitor insulating material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages, and remains after removal of the programming voltage (at least for a time). Each polarization state has a different charge-stored capacitance from the other, and which ideally can be used to write (i.e., store) and to read (i.e., determine) a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor.

A field effect transistor is another type of electronic component that may be used in a memory cell. These transistors comprise a pair of source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Field effect transistors may be ferroelectric wherein at least some portion of the gate construction (e.g., the gate insulator) comprises ferroelectric material. The two different polarized states of the ferroelectric material in transistors may be characterized by different threshold voltage ($V_t$) for the transistor or by different channel conductivity for a selected operating voltage.

Capacitors and transistors may be used in circuitry other than memory circuitry.

BRIEF DESCRIPTION OF THE DRAWINGS

FIG. 5 is a diagrammatic cross-sectional view of a portion of a substrate construction in process in accordance with an embodiment of the invention.

FIG. 6 is a diagrammatic cross-sectional view of a portion of a substrate construction in process in accordance with an embodiment of the invention.

FIG. 7 is a diagrammatic cross-sectional view of a portion of a substrate construction in process in accordance with an embodiment of the invention.

FIG. 8 is a diagrammatic cross-sectional view of a portion of a substrate construction in process in accordance with an embodiment of the invention.

DETAILED DESCRIPTION OF EXAMPLE EMBODIMENTS

Embodiments of the invention encompass a method used in forming an electronic device that comprises conductive material and ferroelectric material. Embodiments of the invention also encompass an electronic device independent of method of manufacture. Embodiments of the invention also encompass a ferroelectric capacitor independent of method of manufacture. Embodiments of the invention also encompass a ferroelectric field effect transistor independent of method of manufacture.

Figure 1:
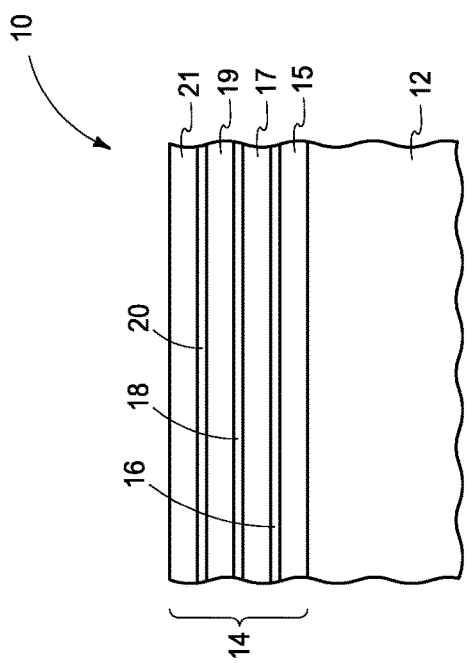
FIG. 1 is a diagrammatic cross-sectional view of a portion of a substrate construction in process in accordance with an embodiment of the invention.

Referring to FIG. 1, some method embodiments are initially described with reference to an example substrate fragment or construction 10 comprising a base substrate 12, and which may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Materials may be aside, below, and/or above the FIG. 1—depicted materials. For example, other partially or wholly fabricated components of integrated circuitry may be provided somewhere about or within fragment 10. Substrate 12 may comprise any one or more of conductive/conductor/conducting (i.e., electrically herein), semiconductive/semiconductor/semiconducting, or insulative/insulator/insulating (i.e., electrically herein) materials. A composite stack 14 has been formed over base substrate 12. In the context of this document, "composite stack" means a construction comprising multiple layers wherein individual of at least two different composition materials are in different layers and without precluding intermixing of at least some immediately adjacent of the layers. Use of "layer" and "layers" does not require blanketing or complete coverage of such over underlying material, and such may be discontinuous or only partially received over underlying material. Composite stack 14 comprises multiple metal oxide-comprising insulator materials 15, 17, 19, and 21 and multiple non-ferroelectric insulating materials 16, 18, and 20. Accordingly, example construction 10 is shown as comprising four metal oxide-comprising insulator materials and three non-ferroelectric insulating materials. More of such materials may be provided, with a construction in accordance with the invention comprising as a minimum three multiple metal oxide-comprising insulator materials and two non-ferroelectric insulating materials. At least one of the metal oxide-comprising insulator materials is between and directly against immediately-adjacent of the non-ferroelectric insulating materials. The multiple metal oxide-comprising insulator materials are of different composition from that of their immediately-adjacent non-ferroelectric insulating materials. Materials 15, 17, 19, and 21 may individually comprise, consist essentially of, or consist of one of more metal oxide insulating material(s). Materials 16, 18, and 20 may individually comprise, consist essentially of, or consist of one of more non-ferroelectric insulating material(s). Example individual thickness for metal oxide-comprising insulator materials 15, 17, 19, and 21 is 10 Angstroms to 100 Angstroms, while that for non-ferroelectric insulating materials 16, 18, and 20 is 1 Angstrom to 30 Angstroms.

Any suitable existing or yet-to-be-developed material may be used for metal oxide-comprising insulator material 15, 17, 19, and 21 so long as such material is, or is capable of being rendered, ferroelectric. In one embodiment, metal oxide-comprising insulator material 15, 17, 19, and 21 comprises one or more of transition metal oxide, zirconium, zirconium oxide, hafnium, hafnium oxide, lead zirconium titanate, tantalum oxide, strontium oxide, strontium titanium oxide, titanium oxide, and barium strontium titanate, and which may have dopant therein which comprises one or more of silicon, aluminum, lanthanum, yttrium, erbium, calcium, magnesium, strontium, lutetium, dysprosium, gadolinium, praseodymium, chromium, niobium, tantalum, hafnium, zirconium, vanadium manganese, cobalt, nickel, carbon and any other rare earth element. One particular example is a hafnium and zirconium based oxide having suitable dopant therein. Other examples include a hafnium and silicon based oxide having suitable dopant therein; a yttrium and zirconium based oxide having suitable dopant therein; and a hafnium, silicon, and zirconium based oxide. By way of further examples, any of the metal oxide-comprising insulator materials described in U.S. Pat. No. 7,709,359 to Boeske et al. and/or U.S. Pat. No. 8,304,823 to Boeske may be used. Metal oxide-comprising insulator materials 15, 17, 19, and/or 21 may be deposited in any phase (e.g., amorphous or one or more crystalline phases).

In one embodiment, one or more of non-ferroelectric insulating materials 16, 18, and 20 comprise(s) $SiO_x$, and in one embodiment comprises C (e.g., insulative amorphous carbon), including a combination of $SiO_x$ and C among materials, or within a single material, 16, 18, and 20. In one embodiment, one or more of non-ferroelectric insulating materials 16, 18, and 20 comprise(s) at least one metal oxide. For example, and by way of example only, the at least one metal oxide of one or more of non-ferroelectric insulating materials 16, 18, and 20 may be selected from among one or more of $TiO_x$, $AlO_x$, $Al_2O_3$, $ScO_x$, $Sc_2O_3$, $ZrO_x$, $YO_x$, $Y_2O_3$, $MgO_x$, $MgO$, $HfO_x$, $SrO_x$, $SrO$, $Ta_xO_y$, $NbO_x$, $GdO_x$, $MoO_x$, $RuO_x$, $LaO_x$, $V_xO_y$, $IrO_x$, $CrO_x$, $ZnO_x$, $PrO_x$, $CeO_x$, $SmO_x$, and $LuO_x$. $SiO_x$ and/or C may be combined with any one or more of such materials.

In one embodiment, all of multiple metal oxide-comprising insulator materials 15, 17, 19, and 21 are formed to be of the same composition relative one another in composite stack 14. Alternately in another embodiment, multiple metal oxide-comprising insulator materials 15, 17, 19, and 21 are formed to collectively be of at least two different compositions relative one another in composite stack 14. Analogously, non-ferroelectric insulating materials 16, 18, and 20 may all be of the same composition relative one another in the composite stack or of at least two different compositions relative one another in the composite stack. Therefor and accordingly, reference to "multiple . . . materials" does not inherently mean that such materials are of different compositions relative one another unless additionally so-stated.

Figure 2:
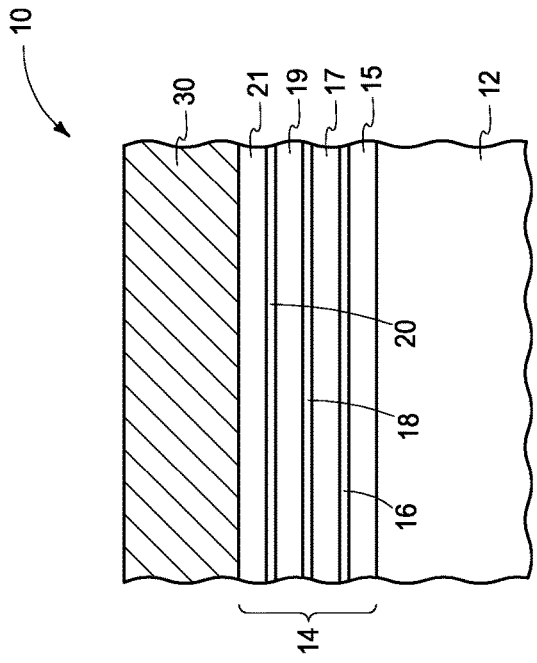
FIG. 2 is a view of the FIG. 1 construction at a processing step subsequent to that shown by FIG. 1.

Referring to FIG. 2, conductive material 30 has been formed adjacent composite stack 14, and in one embodiment is formed directly there-against. In one embodiment and as shown, conductive material 30 is formed above composite stack 14 although alternately, by way of example, such may be formed below composite stack 14. Conductive material 30 may be formed before or after forming composite stack 14. In one embodiment, one of the multiple metal oxide-comprising insulator materials (e.g., material 21) is directly against conductive material 30. Example compositions for conductive material 30 are conductively-doped semiconductive materials and metal materials.

Composite stack 14 is subjected to a temperature of at least 200° C., and in one embodiment to a temperature of at least 350° C. In one embodiment, the temperature is no greater that 1,000° C. Such subjecting to one or more such temperatures may occur before, during, and/or after forming conductive material 30, and during and/or after forming a last portion (e.g., material 21) of composite stack 14. Regardless, composite stack 14 after being subjected to one or more such temperatures comprises multiple ferroelectric metal oxide-comprising insulator materials (e.g., 15, 17, 19, and/or 21) at least one of which (e.g., 17, 19) is between and directly against non-ferroelectric insulating materials (e.g., 17 directly against 16 and 18, and 19 directly against 18 and 20). Composite stack 14 is ferroelectric after being subjected to one or more such temperatures (i.e., composite stack 14 overall is capable of being repeatedly programmed to at least two ferroelectric polarization states even though containing non-ferroelectric material such as materials 16, 18, and 20). Example such conditions include annealing in a furnace using an inert atmosphere with an ambient or substrate temperature of at least 350° C., pressure from 0.1 Torr to 7,600 Torr, for at least 5 seconds.

Materials 15, 17, 19, and/or 21 may or may not be ferroelectric prior to forming conductive material 30 and prior to being subjected to one or more such elevated temperatures. Accordingly, composite stack 14 may or may not be ferroelectric prior to being subjected to one or more such elevated temperatures. Regardless, non-ferroelectric insulating materials 16, 18, and 20 ideally function as non-ferroelectric crystallinity inhibitor materials that inhibit the formation of any non-ferroelectric phase in the composite stack whenever composite stack 14 is subjected to such one or more elevated temperatures (e.g., at least 200° C. or at least 350° C.). Thus, a device formed using composite stack 14 may show more tolerance to exposure to elevated temperatures. The orthorhombic crystalline phase of metal oxide-comprising insulator materials is understood to be that crystalline phase which when in sufficient quantity renders certain metal oxides to be ferroelectric. Accordingly, in one embodiment, subjecting composite stack 14 to one or more of such temperatures increases quantity of orthorhombic crystalline phase in metal oxide-comprising insulator materials 15, 17, 19, and 21. In one embodiment, such metal oxide-comprising insulator materials have 0% orthorhombic crystalline phase before the subjecting to such temperatures, and in one such embodiment are non-ferroelectric and amorphous before such subjecting. In one embodiment, the metal oxide-comprising insulator materials have some orthorhombic crystalline phase before the subjecting. In one such embodiment, such metal oxide-comprising insulator materials are ferroelectric before the subjecting and in another such embodiment are non-ferroelectric before the subjecting. In one embodiment, the metal oxide-comprising insulator materials have multiple different crystalline phases before the subjecting, and the subjecting converts at least some of the metal oxide-comprising insulator materials of non-orthorhombic crystalline phase to be orthorhombic crystalline phase. In one embodiment, the multiple metal oxide-comprising insulator materials comprise multiple different crystalline phases before the subjecting, and the subjecting increases quantity of orthorhombic crystalline phase in the metal oxide-comprising insulator materials compared to non-orthorhombic crystalline phase. In one embodiment, the multiple metal oxide-comprising insulator materials comprise multiple different crystalline phases before the subjecting, and the subjecting does not alter distribution of quantities of the multiple different crystalline phases.

Any other attribute(s) or aspect(s) as shown and/or described herein with respect to other embodiments may be used in the FIGS. 1-2 embodiment.

Figure 3:
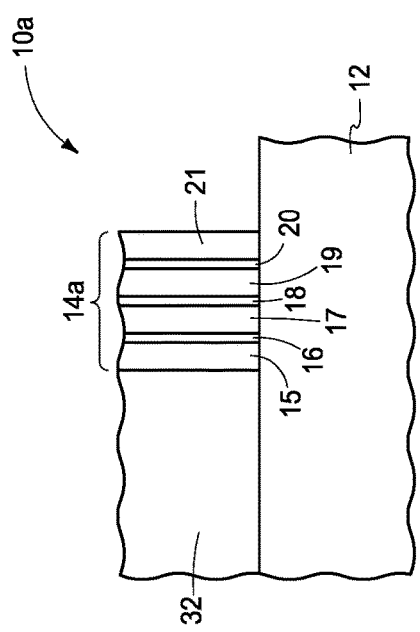
FIG. 3 is a diagrammatic cross-sectional view of a portion of a substrate construction in process in accordance with an embodiment of the invention.
Figure 4:
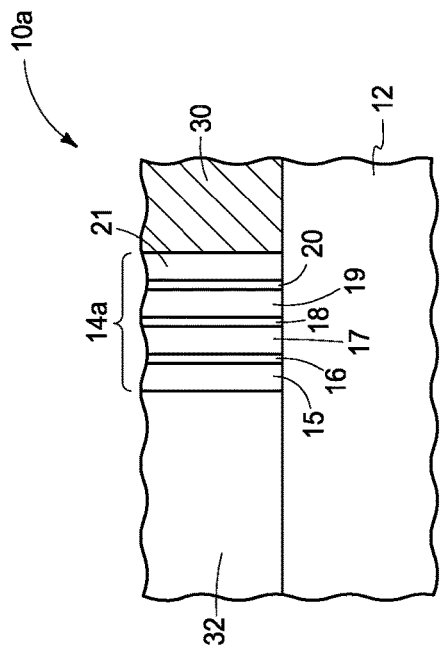
FIG. 4 is a view of the FIG. 3 construction at a processing step subsequent to that shown by FIG. 3.

FIGS. 1 and 2 show an example embodiment wherein ferroelectric composite stack 14 is formed to comprise multiple metal oxide-comprising insulator materials 15, 17, 19, and 21 and non-ferroelectric insulating materials 16, 18, and 20 as being above and below one another. Any other alternate and/or additional orientations may be used, with one such example being shown with respect to a substrate construction 10a in FIGS. 3 and 4. Like numerals from the above-described embodiments have been used where appropriate, with some construction differences being indicated with the suffix "a" or with different numerals. FIGS. 3 and 4 correspond in processing sequence to FIGS. 1 and 2, respectively, and the same or analogous processing may be used. Example construction 10a comprises dielectric material 32 which has been formed and patterned above base substrate 12. Ferroelectric composite stack 14a is formed to comprise multiple metal oxide-comprising insulator materials 15, 17, 19, and 21 and non-ferroelectric insulating materials 16, 18, and 20 that have been formed laterally aside one another. Any other attribute(s) or aspect(s) as shown and/or described herein may be used.

In one embodiment and as shown, one or more of non-ferroelectric insulating materials 16, 18, and 20 are formed to individually be a continuous layer, and in one such embodiment to be of constant thickness. Alternately in one such embodiment, at least one (in one embodiment each) of the non-ferroelectric insulating materials may be formed to be of at least two different thicknesses. For example, FIG. 5 shows an alternate embodiment construction 10b analogous to FIG. 1 and wherein non-ferroelectric insulating materials 16b, 18b, and 20b are individually continuous layers, with layer 18b being of constant thickness and layers 16b and 20b each having at least two different thicknesses. Like numerals from the above-described embodiments have been used where appropriate, with some construction differences being indicated with the suffix "b". FIG. 6 shows another alternate embodiment construction 10c analogous to FIGS. 1 and 5, and wherein non-ferroelectric insulating materials 16c, 18c, and 20c are individually continuous layers, with layers 18c and 20c each being of constant thickness and layer 16c having at least two different thicknesses. Like numerals from the above-described embodiments have been used where appropriate, with some construction differences being indicated with the suffix "c". Processing analogous to that shown and described above with respect to FIGS. 2 and 4 could follow that which is shown with respect to FIGS. 5 and 6, respectively. Any other attribute(s) or aspect(s) as shown and/or described herein may be used with respect to the embodiments described with reference to FIGS. 5 and 6.

In one embodiment and as shown in each of constructions 10, 10a, 10b, and 10c, all of the ferroelectric metal oxide-comprising insulator materials individually have maximum thickness that is greater than individual maximum thickness of each of the non-ferroelectric insulating materials in the composite stack.

Additional embodiments of the invention comprise forming at least one of the non-ferroelectric insulating materials to be a discontinuous layer, with two immediately-adjacent of the metal oxide-comprising insulator materials being directly against one another through the discontinuous layer. Example such embodiments are shown with respect to a construction 10d in FIG. 7 and a construction 10e in FIG. 8. In FIG. 7, like numerals from the above-described embodiments have been used where appropriate, with some construction differences being indicated with the suffix "d", and analogously in FIG. 8 with the suffix "e". FIG. 7 is analogous in processing to FIGS. 1 and 5, and FIG. 8 is analogous in processing to FIGS. 3 and 6. In construction 10*d*, and by way of example only, layers 16*d* and 20*d* are discontinuous and layer 18*d* is continuous. In construction 10*e*, and by way of example only, layers 16*e* and 18*e* are discontinuous and layer 20*e* is continuous. Each of layers 16*d/e*, 18*d/e*, and 20*d/e* are shown as respectively being of constant thickness, although any one or more of such may be of at least two different thickness. Processing analogous to that shown and described above with respect to FIGS. 2 and 4 could follow that which is shown with respect to FIGS. 7 and 8, respectively. Any other attribute(s) or aspect(s) as shown and/or described herein may be used with respect to the embodiments described with reference to FIGS. 7 and 8.

Any of the attributes or aspects described above with respect to one or more of layers 16/16*b*/16*c*/16*d*/16*e*, 18/18*b*/18*c*/18*d*/18*e*, and 20/20*b*/20*c*/20*d*/20*e* also apply to one or more of layers 15, 17, 19, and 21.

Figure 9:
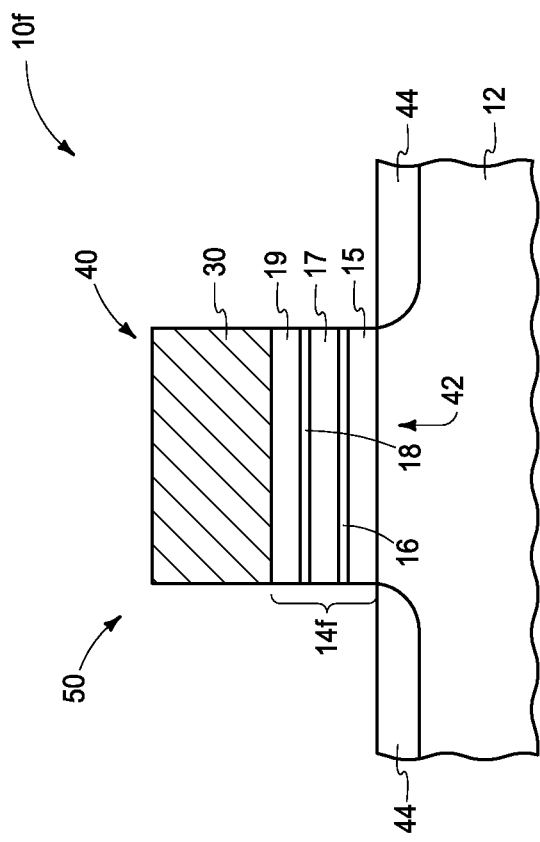
FIG. 9 is a diagrammatic cross-sectional view of a field effect transistor in accordance with an embodiment of the invention.

Methods in accordance with the invention may be used in forming any electronic device, whether existing or yet-to-be-developed, that comprises conductive material and ferroelectric material. In one embodiment and as shown in FIG. 9 with respect to a construction 10*f*, subsequent processing has been conducted with respect to an example substrate fragment/construction like 10 of FIG. 2, for example in forming a field effect transistor 50 comprising a ferroelectric field effect transistor gate construction 40. Like numerals from the above-described embodiments have been used where appropriate, with some construction differences being indicated with the suffix "f" or with different numerals. Example ferroelectric composite stack 14*f* of gate construction 40 in an example finished construction comprises only three ferroelectric metal oxide-comprising insulator materials 15, 17, and 19 and only two non-ferroelectric insulating materials 16 and 18. More ferroelectric metal oxide-comprising insulator materials (not shown) and more non-ferroelectric insulating materials (not shown) may of course be used. Ferroelectric composite stack 14*f* functions as a ferroelectric gate insulator of field effect transistor 50. Base substrate 12 is shown as comprising suitably doped semiconductive material to provide a semiconductive channel 42 operatively proximate gate construction 40 and a pair of source/drain regions 44 are on opposite sides of channel 42.

Figure 10:
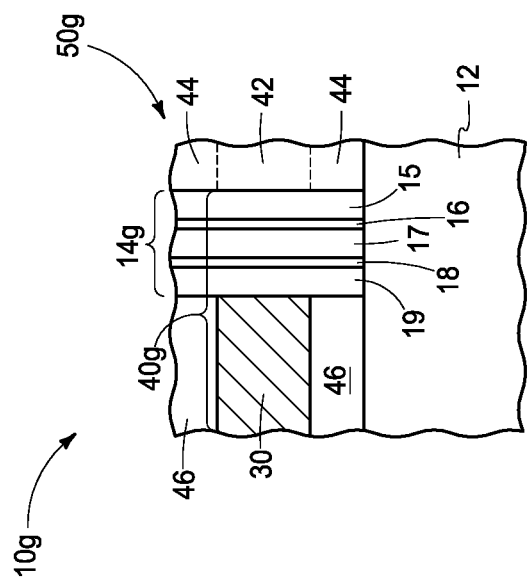
FIG. 10 is a diagrammatic cross-sectional view of a field effect transistor in accordance with an embodiment of the invention.

In one embodiment, the field effect transistor is formed to be horizontal or within 10° of horizontal, for example as shown in FIG. 9. Alternately and by way of example only, a field effect transistor may be formed to be elevationally-extending, and in one such embodiment to be vertical or within 10° of vertical, for example as shown with a construction 10*g* in FIG. 10 and which has a ferroelectric composite stack 14*g*. Like numerals from the above-described embodiments have been used where appropriate, with some construction differences being indicated with the suffix "g" or with different numerals. Gate construction 40*g* of field effect transistor 50*g* is shown as being elevationally received between dielectric layers 46 (e.g., silicon dioxide and/or silicon nitride). Field effect transistors 40, 40*g* may also include additional structure, for example a reversibly programmable charge-storage region (not shown) as part of the gate construction between the gate insulator and the conductive gate. Any other attribute(s) or aspect(s) as shown and/or described herein may be used with respect to the embodiments described with reference to FIGS. 9 and 10.

Figure 12:
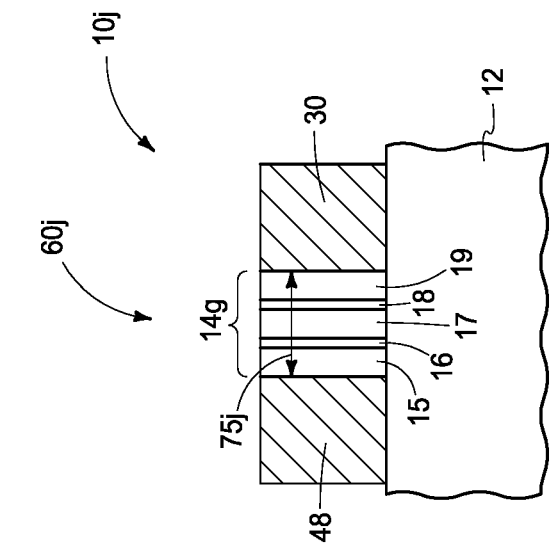
FIG. 12 is a diagrammatic cross-sectional view of a capacitor in accordance with an embodiment of the invention.
Figure 11:
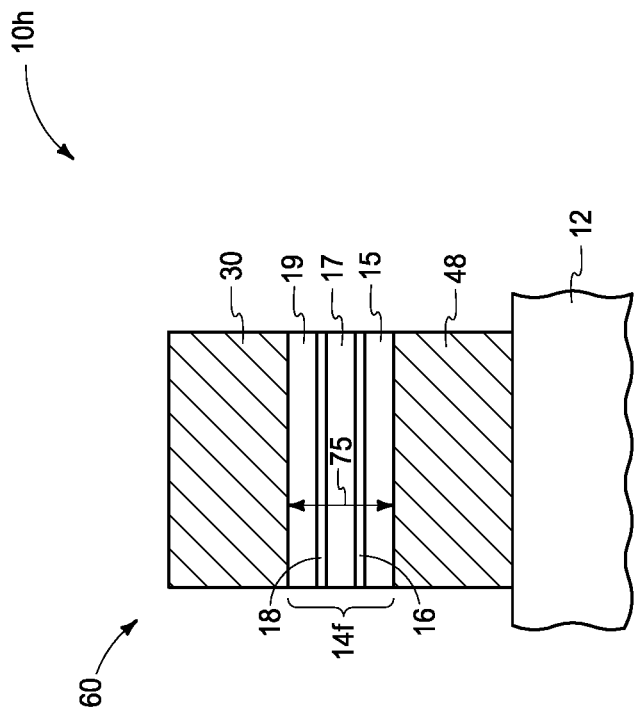
FIG. 11 is a diagrammatic cross-sectional view of a capacitor in accordance with an embodiment of the invention.

Alternate example embodiments are next described with reference to a construction 10*h* in FIG. 11. Like numerals from the above-described embodiments have been used where appropriate, with some construction differences being indicated with the suffix "h" or with different numerals. Composite stack 14*f* has been formed over conductor material 48 and which may be of the same or different composition from that of conductive material 30. Conductive material 30, composite stack 14*f*, and conductor material 48 have been patterned into a ferroelectric capacitor construction 60, with materials 30 and 48 functioning as capacitor electrodes and composite stack 14*f* functioning as the ferroelectric capacitor insulator there-between. In one embodiment and as shown, ferroelectric capacitor construction 60 has been constructed to in operation have an electric field 75 that is oriented vertically or within 10° of vertical. Alternately, and by way of example only, a ferroelectric capacitor may be formed to have an electric field that is oriented horizontally or within 10° of horizontal. By way of example, such is shown with respect to a capacitor 60*j* having a ferroelectric composite stack 14*g* in a construction 10*j* in FIG. 12. Like numerals from the above-described embodiments have been used where appropriate, with some construction differences being indicated with the suffix "j". In operation, capacitor 60*j* has an electric field 75*j* that is oriented horizontally or within 10° of horizontal. Any other attribute(s) or aspect(s) as shown and/or described herein may be used with respect to the embodiments described with reference to FIGS. 11 and 12.

An embodiment of the invention includes a ferroelectric capacitor independent of method of manufacture, yet for example comprising either of the ferroelectric capacitors 60 and 60*j* described above with respect to method embodiments. Such a ferroelectric capacitor in accordance with a device embodiment of the invention comprises two conductive capacitor electrodes (e.g., materials 30 and 48) having a ferroelectric composite stack there-between (e.g., either 14*f* or 14*g* in FIGS. 11 and 12). The composite stack comprises multiple ferroelectric metal oxide-comprising insulator materials (e.g., 15/17/19). At least one of the multiple ferroelectric metal oxide-comprising insulator materials (e.g., 17) is between and directly against non-ferroelectric insulating materials (e.g., 16, 18). Any other aspect(s) and/or attribute(s) as described above in the method embodiments may be used or apply in a ferroelectric capacitor device construction in accordance with the invention independent of method of manufacture.

An embodiment of the invention comprises a ferroelectric field effect transistor independent of method of manufacture, yet for example comprising either of the ferroelectric field effect transistors 50 and 50*g* described above with respect to method embodiments. Such a transistor comprises a pair of source/drain regions (e.g., 44) having a semiconductive channel (e.g., 42) there-between. The ferroelectric field effect transistor comprises a gate construction (e.g., either 40 or 40*g*) that comprises a conductive gate electrode (e.g., material 30 in FIG. 9 or 10) and a ferroelectric gate insulator between the gate electrode and the channel. The ferroelectric gate insulator comprises a ferroelectric composite stack (e.g., either 14*f* or 14*g* in FIGS. 9 and 10) comprising multiple ferroelectric metal oxide-comprising insulator materials (e.g., 15, 17, 19). At least one of the multiple ferroelectric metal oxide-comprising insulator materials (e.g., 17) is between and directly against non-ferroelectric insulating materials (e.g., 16, 18). Any other aspect(s) and/or attribute(s) as described above in the method embodiments may be used or apply in a ferroelectric field effect transistor device construction in accordance with the invention independent of method of manufacture.

An embodiment of the invention includes an electronic device independent of whether such comprises a capacitor and/or field effect transistor. Such a device comprises conductive material and ferroelectric material. A conductive component (e.g., material 30 and/or material 48) is proximate a ferroelectric composite stack (e.g., 14, 14a, 14c, 14d, 14e, 14f, and/or 14g). The ferroelectric composite stack comprises multiple ferroelectric metal oxide-comprising insulator materials. At least one of the multiple ferroelectric metal oxide-comprising insulator materials is between and directly against non-ferroelectric insulating materials. Any other aspect(s) and/or attribute(s) as described above in the method embodiments may be used or apply in an electronic device construction in accordance with the invention independent of method of manufacture.

Electronic devices in accordance with the invention due to presence of non-ferroelectric insulating materials in the composite stack may experience one or more of improved reliability as respects imprint and retention characteristics, tolerance to exposure to elevated temperature, longer life.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extending elevationally" refer to a direction that is angled away by at least 45° from exactly horizontal. Further, "extend(ing) elevationally" and "elevationally-extending" with respect to a field effect transistor are with reference to orientation of the transistor's channel length along which current flows in operation between the source/drain regions. For bipolar junction transistors, "extend(ing) elevationally" and "elevationally-extending" are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Further, a material is "crystalline" if at least 90% by volume of the material is crystalline and a material is "amorphous" if at least 90% by volume of the material is amorphous.

Also, "immediately-adjacent" with respect to stated materials means that there is no other of such stated material(s) between those stated materials that are immediately-adjacent one another. Specifically, metal oxide-comprising insulator materials that are immediately-adjacent one another have no other metal oxide-comprising insulator material between those metal oxide-comprising insulator materials that are stated to be immediately-adjacent one another, yet may have other material there-between that is not a metal oxide-comprising insulator material. Further, non-ferroelectric insulating materials that are immediately-adjacent one another have no other non-ferroelectric insulating material between those non-ferroelectric insulating materials that are stated to be immediately-adjacent one another, yet may have other material there-between that is not a non-ferroelectric insulating material.

CONCLUSION

In some embodiments, a method used in forming an electronic device comprising conductive material and ferroelectric material comprises forming a composite stack comprising multiple metal oxide-comprising insulator materials. At least one of the metal oxide-comprising insulator materials is between and directly against non-ferroelectric insulating materials. The multiple metal oxide-comprising insulator materials are of different composition from that of immediately-adjacent of the non-ferroelectric insulating materials. The composite stack is subjected to a temperature of at least 200° C. After the subjecting, the composite stack comprises multiple ferroelectric metal oxide-comprising insulator materials at least one of which is between and directly against non-ferroelectric insulating materials. After the subjecting, the composite stack is ferroelectric. Conductive material is formed and that is adjacent the composite stack.

In some embodiments, an electronic device comprising conductive material and ferroelectric material comprises a conductive component proximate a ferroelectric composite stack. The ferroelectric composite stack comprises multiple ferroelectric metal oxide-comprising insulator materials. At least one of the multiple ferroelectric metal oxide-comprising insulator materials is between and directly against non-ferroelectric insulating materials.

In some embodiments, a ferroelectric capacitor comprises two conductive capacitor electrodes having a ferroelectric composite stack there-between. The ferroelectric composite stack comprises multiple ferroelectric metal oxide-comprising insulator materials. At least one of the multiple ferroelectric metal oxide-comprising insulator materials is being between and directly against non-ferroelectric insulating materials.

In some embodiments, a ferroelectric field effect transistor comprises a pair of source/drain regions having a semiconductive channel there-between. A gate construction of the transistor comprises a conductive gate electrode and a ferroelectric gate insulator between the gate electrode and the channel. The ferroelectric gate insulator comprises a ferroelectric composite stack comprising multiple ferroelectric metal oxide-comprising insulator materials. At least one of the multiple ferroelectric metal oxide-comprising insulator materials is between and directly against non-ferroelectric insulating materials.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming an electronic device comprising conductive material and ferroelectric material, the method comprising:
   forming a composite stack comprising multiple metal oxide-comprising insulator materials and multiple non-ferroelectric insulating materials, at least one of the multiple metal oxide-comprising insulator materials comprising a first layer that is between and directly against immediately-adjacent of the multiple non-ferroelectric insulating materials that are on opposing sides of the first layer, the multiple metal oxide-comprising insulator materials being of different composition from that of the immediately-adjacent non-ferroelectric insulating materials, at least one of the multiple metal oxide-comprising insulator materials comprising one or more members of the group consisting of zirconium, lead zirconium titanate, tantalum oxide, strontium oxide, strontium titanate oxide, titanium oxide and barium strontium titanate;
   subjecting the composite stack to a temperature of at least 200° C., the composite stack after the subjecting comprising multiple ferroelectric metal oxide-comprising insulator materials at least one of which comprises the first layer, the composite stack after the subjecting being ferroelectric and comprising the multiple non-ferroelectric insulating materials, the multiple ferroelectric metal oxide-comprising insulator materials comprising second and third layers that are respectively directly against one of the multiple non-ferroelectric insulating materials that are on the opposing sides of the first layer after the subjecting; and
   forming conductive material that is adjacent the composite stack.

2. The method of claim 1 wherein the subjecting is to a temperature of at least 350° C.

3. The method of claim 1 wherein the subjecting is to a temperature no greater than 1,000° C.

4. The method of claim 1 wherein forming the conductive material and the composite stack are formed to be directly against one another.

5. The method of claim 4 wherein one of the multiple ferroelectric metal oxide-comprising insulator materials is directly against the conductive material.

6. The method of claim 1 wherein all of the multiple metal oxide-comprising insulator materials are formed to be of the same composition relative one another in the composite stack.

7. The method of claim 1 wherein the multiple metal oxide-comprising insulator materials are formed to collectively be of at least two different compositions relative one another in the composite stack.

8. The method of claim 1 wherein the respective non-ferroelectric insulating materials that are directly against the multiple ferroelectric metal oxide-comprising insulator materials are formed to all be of the same composition relative one another in the composite stack.

9. The method of claim 1 wherein the respective non-ferroelectric insulating materials that are directly against the multiple ferroelectric metal oxide-comprising insulator materials are formed to be of at least two different compositions relative one another in the composite stack.

10. The method of claim 1 wherein at least one of the multiple non-ferroelectric insulating materials is formed as a continuous layer.

11. The method of claim 10 wherein the continuous layer is of constant thickness.

12. The method of claim 10 wherein the continuous layer is of at least two different thicknesses.

13. The method of claim 1 wherein the multiple non-ferroelectric insulating materials are formed to each be a continuous layer.

14. The method of claim 1 wherein at least one of the multiple non-ferroelectric insulating materials is formed as a discontinuous layer, and wherein two immediately-adjacent of the multiple metal oxide-comprising insulator materials are directly against one another through the discontinuous layers.

15. The method of claim 1 wherein at least one of the multiple non-ferroelectric insulating materials is formed to comprise C.

16. The method of claim 1 wherein at least one of the multiple non-ferroelectric insulating materials is formed to comprise at least one metal oxide.

17. The method of claim 16 wherein the at least one metal oxide of the at least one non-ferroelectric insulating material is selected from among one or more of $TiO_x$, $AlO_x$, $Al_2O_3$, $ScO_x$, $Sc_2O_3$, $ZrO_x$, $YO_x$, $Y_2O_3$, $MgO_x$, $MgO$, $HfO_x$, $SrO_x$, $SrO$, $Ta_xO_y$, $NbO_x$, $GdO_x$, $MoO_x$, $RuO_x$, $LaO_x$, $V_xO_y$, $IrO_x$, $CrO_x$, $ZnO_x$, $PrO_x$, $CeO_x$, $SmO_x$, and $LuO_x$.

18. The method of claim 1 wherein all of the multiple ferroelectric metal oxide-comprising insulator materials are formed to individually have maximum thickness that is greater than individual maximum thickness of each of the multiple non-ferroelectric insulating materials in the composite stack.

19. The method of claim 1 wherein the subjecting increases quantity of orthorhombic crystalline phase in the multiple metal oxide-comprising insulator materials.

20. The method of claim 19 wherein the multiple metal oxide-comprising insulator materials have 0% orthorhombic crystalline phase before the subjecting.

21. The method of claim 20 wherein the multiple metal oxide-comprising insulator materials are non-ferroelectric and amorphous before the subjecting.

22. The method of claim 19 wherein the multiple metal oxide-comprising insulator materials have some orthorhombic crystalline phase before the subjecting.

23. The method of claim 22 wherein the multiple metal oxide-comprising insulator materials are ferroelectric before the subjecting.

24. The method of claim 22 wherein the multiple metal oxide-comprising insulator materials are non-ferroelectric before the subjecting.

25. The method of claim 19 wherein the multiple metal oxide-comprising insulator materials have multiple different crystalline phases before the subjecting, the subjecting converting at least some of the multiple metal oxide-comprising insulator materials of non-orthorhombic crystalline phase to be orthorhombic crystalline phase.

26. The method of claim 1 wherein the multiple metal oxide-comprising insulator materials comprise multiple different crystalline phases before the subjecting, the subjecting increasing quantity of orthorhombic crystalline phase in the multiple metal oxide-comprising insulator materials compared to non-orthorhombic crystalline phase.

27. The method of claim 1 wherein the multiple metal oxide-comprising insulator materials comprise multiple different crystalline phases before the subjecting, the subjecting not altering distribution of quantities of the multiple different crystalline phases.

28. The method of claim 1 wherein the multiple non-ferroelectric insulating materials function as crystallinity inhibitor materials that inhibit formation of any non-ferroelectric phase in the multiple metal-oxide comprising insulating materials when composite stack is subjected to a temperature of at least 200° C.

29. The method of claim 1 wherein the composite stack is formed to comprise the multiple metal oxide-comprising insulator materials and the multiple non-ferroelectric insulating materials to be above and below one another.

30. The method of claim 1 wherein the composite stack is formed to comprise the multiple metal oxide-comprising insulator materials and the multiple non-ferroelectric insulating materials to be laterally aside one another.

31. The method of claim 1 comprising forming the composite stack and the conductive material into a ferroelectric field effect transistor gate construction of a field effect transistor.

32. The method of claim 31 wherein the field effect transistor is formed to be elevationally extending.

33. The method of claim 32 wherein the field effect transistor is formed to be vertical or within 10° of vertical.

34. The method of claim 1 wherein the composite stack is formed over conductor material, and further comprising:

forming the conductive material, the composite stack, and the conductor material into a ferroelectric capacitor construction.

35. The method of claim 34 wherein the ferroelectric capacitor construction in operation has electric field that is oriented horizontal or within 10° of horizontal.

* * * * *